United States Patent [19]

Lewis et al.

[11] Patent Number: 4,661,436
[45] Date of Patent: Apr. 28, 1987

[54] PROCESS OF FORMING HIGH CONTRAST RESIST PATTERN IN POSITIVE PHOTOAGENT MATERIAL USING ALKALAI DEVELOPER WITH FLUOROCARBON SURFACTANT

[75] Inventors: James M. Lewis, Williamsville; Robert A. Owens, East Amherst; Andrew J. Blakeney, Blasdell, all of N.Y.

[73] Assignee: Petrarch System, Inc., Bristol, Pa.

[21] Appl. No.: 767,318

[22] Filed: Aug. 19, 1985

Related U.S. Application Data

[62] Division of Ser. No. 505,571, Jun. 17, 1983, abandoned.

[51] Int. Cl.⁴ .............................................. G03F 7/26
[52] U.S. Cl. .................................. 430/326; 430/191; 430/192; 430/193; 430/309; 430/330
[58] Field of Search ............... 430/326, 309, 331, 192, 430/191

[56] References Cited

U.S. PATENT DOCUMENTS

| | | | |
|---|---|---|---|
| 3,586,504 | 6/1971 | Coates et al. | 430/331 |
| 3,868,254 | 2/1975 | Wemmers | 430/331 |
| 4,080,246 | 3/1978 | Battisti et al. | 430/192 |
| 4,239,661 | 12/1980 | Muraoka et al. | 252/54.1 |
| 4,275,100 | 6/1981 | Datta | 428/65 |
| 4,302,348 | 11/1981 | Reguejo | 252/135 |
| 4,381,340 | 4/1983 | Walls | 430/331 |
| 4,487,823 | 12/1984 | Lehmann et al. | 430/191 |
| 4,504,566 | 3/1985 | Dueber | 430/192 |

FOREIGN PATENT DOCUMENTS 2023858  1/1980  United Kingdom ........... 430/192

Primary Examiner—Charles L. Bowers, Jr.
Attorney, Agent, or Firm—Felfe & Lynch

[57] ABSTRACT

A positive photoresist metal ion aqueous developer is provided that gives a high contrast to the photoresist.

The developer disclosed comprises a formulation of aqueous alkali-base such as potassium hydroxide and a fluorocarbon surfactant. The incorporation of the fluorocarbon surfactant provides the unexpected increase in the contrast of the photoresist. The addition of the fluorocarbon surfactant increases the gamma from a typical photoresist gamma ($\gamma$) of 3 or less to a gamma greater than 10.

The high contrast photoresist provides linewidth control and affords improved process latitude in photoresist imaging. The linewidth control is particularly critical in cases where fine lines are to be defined in the resist that covers steps or topography on the coated substrate. The higher the contrast, the less affected the resist by the topography, provided the exposure is adequate to expose the resist. The process latitude afforded by the high contrast is a result of the ability to over develop (develop longer) the exposed resist without affecting the unexposed resist in the adjacent areas.

6 Claims, 1 Drawing Figure

DEVELOPER CONTRAST CURVE

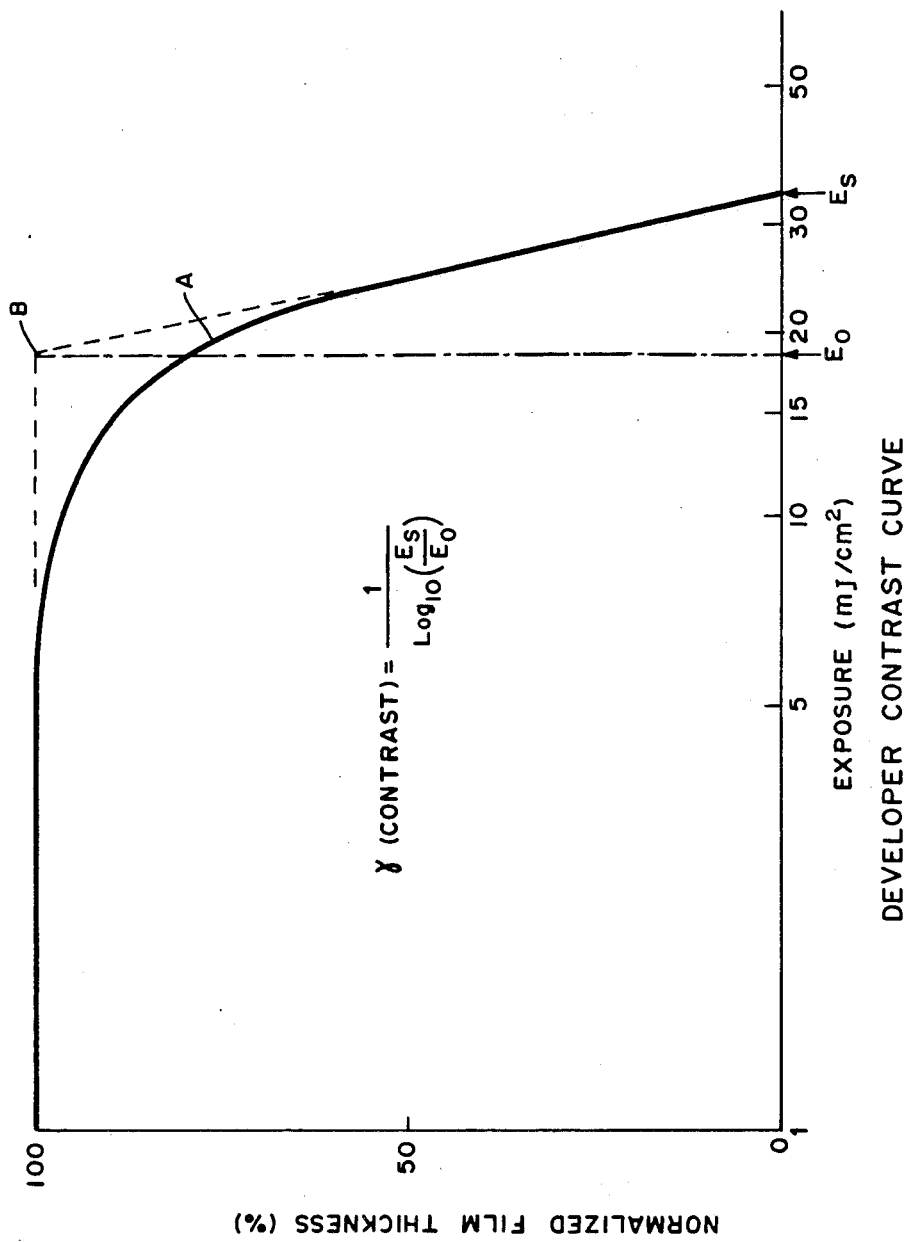

PROCESS OF FORMING HIGH CONTRAST RESIST PATTERN IN POSITIVE PHOTOAGENT MATERIAL USING ALKALAI DEVELOPER WITH FLUOROCARBON SURFACTANT

This application is a division of application Ser. No. 505,571, filed 6-17-83, abandoned.

BACKGROUND OF THE INVENTION

1. Field of the Invention

This invention relates to a novel developer and improved method for developing positive photoresist layers, and more particularly to a developer used in the processing of alkali soluble resin—diazo ketone photoresists to increase the contrast of the developed photoresists. The invention is especially useful because it results in a higher contrast that renders the adverse effects of any exposure differences which occur less significant, i.e., the higher the contrast, the less affected are the geometry dimensions in the patterned photoresist by exposure variations; provided, of course, that the exposure is adequate to expose the photoresist.

2. Description of the Prior Art

Photoresists are materials which change their solubility response to a developer solution after a film of the photoresist has been applied to a surface and exposed to an irradiation source, such as to ultraviolet light. As a consequence of the exposure, a different solubility rate results between the exposed and unexposed (masked over) portions of the photoresist film that yields a surface relief pattern after the development of the film. Those photoresists which become more soluble in the exposed regions are referred to as positive photoresists. However, because the alteration of the solubility of the photoresist is only a relative change and even the less soluble unexposed portions of the photoresist dissolve to some extent, any process which enhances the developing rate difference (typically called contrast) between the relatively soluble and relatively insoluble photoresist portion is advantageous.

Positive photoresists are typically comprised of an aqueous alkaline soluble resin, such as novolak resin or poly(p-hydroxystyrene), and a diazonaphthoquinone sulfonic acid ester sensitizer. The resin and sensitizer may be applied by a method such as spin coating from an organic solvent or solvent mixture onto a substrate, such as silicon wafers and chrome plated glass plates. Developers that have been used to process the positive photoresists are aqueous alkaline solutions, such as sodium silicate, potassium hydroxide, sodium hydroxide, tetramethyl ammonium hydroxide and ammonium hydroxide. The developer removes the areas of the coated photoresist film that have been exposed to light or other form of irradiation so as to produce a pattern in the photoresist film.

The existing positive photoresist systems can have a contrast (gamma) of three (3) to five (5) depending upon process conditions. The problems associated with a gamma of this order are evident in the reported performance. Typically the higher gammas of five are obtained by using a weak developer and a prolonged developing with a resulting loss of sensitivity in order to control the process. It is thus apparent that a need exists for a developer which is capable of providing a gamma of the order of at least 5 and preferably of the order of 10 or greater without sacrificing sensitivity.

SUMMARY OF THE INVENTION

In accordance with the invention, a positive photoresist metal ion aqueous base developer is provided that gives high contrast to the photoresist. The gamma obtained is greater than 5 and optimally greater than 10. The high contrast provides linewidth control and process latitude in photoresist imaging. The linewidth control is important in cases where fine lines are to be defined in the resist that covers steps or topography on the coated substrate. The linewidth of the patterned resist geometries change in dimension as the line crosses the step. The higher the contrast of the resist, the less the effect on dimensional changes crossing a step. The process latitude afforded by the high contrast is a result of the ability to over develop (develop longer) the exposed resist without affecting the unexposed resist in the adjacent areas. As a result, extremely small geometries of less than one micrometer can be patterned and the resist processing is less susceptible to changes in conditions, such as exposure, developer concentration and temperature.

The high contrast is obtainable in accordance with the invention by the addition of a nonionic fluorocarbon surfactant to an aqueous alkali metal base, preferably potassium or sodium hydroxide, developer. The incorporation of the surfactant yields an unexpected and most practical improvement in the photoresist developer. The improvement in the contrast using the fluorocarbon surfactant modified developer of the invention compared to contrasts obtained with developers with different surfactants or in which the fluorocarbon surfactant was omitted was typically threefold and greater.

BRIEF DESCRIPTION OF THE DRAWING

The FIGURE of the drawing comprises a plot of the normalized film thickness remaining after the film has been developed versus the log of the exposure given the film as shown in Curve A. The exposure may be expressed in any suitable unit of measure that is descriptive of radiation impinging on the resist such as millijoules per square centimeter (mJ/cm$^2$). The film thickness remaining is normalized to the thickness of the unexposed film after development. The contrast is expressed as the negative of the slope of the tangent to the curve over the straight line portion where film loss is occurring. The equation for calculating the gamma (Y) is:

$$\gamma = \frac{1}{\text{Log}_{10}\frac{E_s}{E_o}}$$

where $E_s$ is the exposure level at which the tangent line, $\overline{E_sB}$, intercepts the axis for no film remaining and $E_o$ is the exposure at which the tangent to the curve intercepts the full film thickness remaining (Point B).

DESCRIPTION OF THE PREFERRED EMBODIMENT

The photoresists employed with the developer of the present invention are those sensitizer-resin compositions in which the exposed portions of the composition becomes more soluble upon exposure.

Suitable sensitizers used in positive photoresists of this kind are diazo ketones having diazo and keto groups at adjacent positions on the molecule, such as the quinone-diazide sulfonic acid derivatives which are described in U.S. Pat. Nos. 2,958,599; 3,046,110; 3,046,114; 3,046,116; 3,046,118; 3,046,119; 3,046,121; 3,046,122; 3,046,123; 3,106,465; 3,148,983; 3,635,709; 3,711,285; 4,174,222 which are hereby incorporated by reference. Examples of typical photosensitive compounds used in positive photoresists are shown in Table I. The photosensitizer acts to decrease the solubility of the resin. Upon irradiation, the photosensitizer undergoes a chemical reaction to form a carboxylic acid which increases the rate of solubilization of the photoresist in the exposed areas.

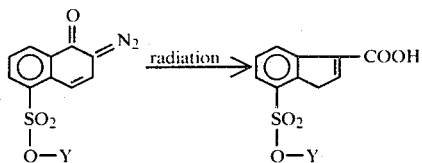

TABLE I

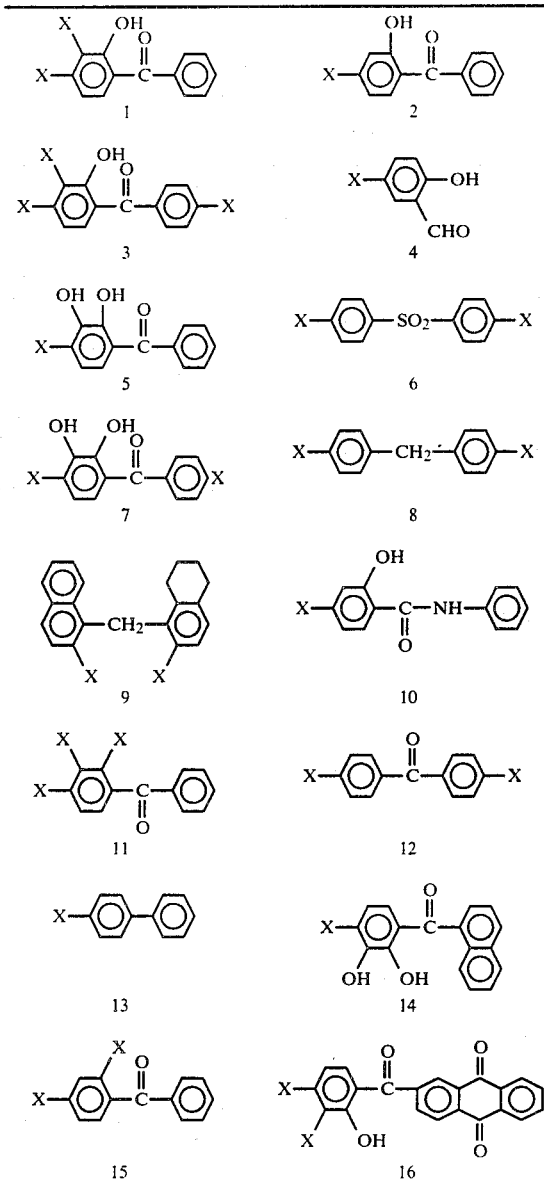

TABLE I-continued $X-CH_2CHBrCH_2Br$
17

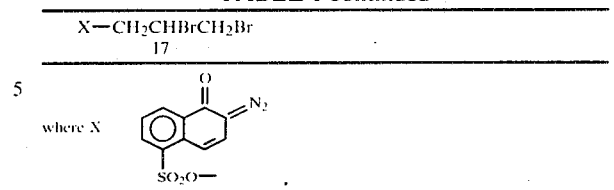

In general, photosensitizers which contain more than one diazonaphthoquinone group are preferred because they appear to provide higher contrast photoresists. Suitable alkali soluble resins may be employed in the positive photoresists. Those contemplated by this invention are the prepolymerized phenolic-aldehyde resins, e.g., phenol formaldehyde, which are known as novolaks and are available commercially. Resins of this kind are disclosed, for example, in U.S. Pat. Nos. 3,201,239; 3,868,254; 4,123,219 and 4,173,470, the disclosures of which are incorporated herein by reference. These phenolic-aldehyde resinous compounds must be soluble in organic solvents and aqueous alkaline solutions.

A number of phenolic compounds and aldehyde or aldehyde producing compounds will yield novolak resins through well-known syntheses. Phenolic compounds that may be used include, but not limited to, phenol, xylenol, cresol, resorcinol, naphthol, hydroquinone, alkyl phenols and halogenated phenols. Illustrative of the aldehydes and aldehyde producing compounds that may be used, but not limited to, are formaldehyde, actaldehyde, paraformaldehyde, formaline, acrolein, crotonaldehyde and furfural.

In accordance with the invention, the addition of a nonionic fluorocarbon surfactant to the developer that comprises an aqueous alkali metal base, preferably potassium hydroxide, produced a substantial and unexpected improvement in contrast. Other alkali bases such as sodium hydroxide, sodium silicate, and lithium hydroxide, may also be employed. The surfactants producing this unexpected improvement are those characterized by the formula $R_f$—Y—$(CH_2CH_2O)_mR$, wherein Y is a radical selected from the group —$CH_2CH_2O$—, —$SO_2NR'$, $SO_3$, $SO_2N(R')CH_2CO_2$, $CO_2$ and —CO—NR′ wherein $R_f$ is either a straight or branched chain of the formula $C_pF_{2p+1}$ where p is an integer from 3 to 17; and wherein R is hydrogen or an acyl or alkyl radical of 1 to 30 carbon atoms and m is an integer of 2 to 26 and preferably where m is an integer of 5-26, and R′ is hydrogen or an alkyl radical of 1-6 carbon atoms. Suitable examples of fluorosurfactants of this kind include those shown in Table II and the like and more generally mixtures thereof.

TABLE II

| Example | Fluorosurfactant |
|---|---|
| a | $CF_3(CF_2)_6$—$CH_2CH_2O$—$(CH_2CH_2O)_4H$ |
| b | $CF_3(CF_2)_5$—$\overset{O}{\underset{\|}{C}}$—$N(CH_3)$—$(CH_2CH_2O)_{12}$—$CH_3$ |
| c | $CF_3(CF_2)_3$—$SO_2$—$NH$—$(CH_2CH_2O)_{14}$—$CH_3$ |
| d | $CF_3(CF_2)_8$—$SO_2$—$O$—$(CH_2CH_2O)_8$—$CH_3$ |
| e | $CF_3(CF_2)_5$—$CO$—$O$—$(CH_2CH_2O)_9$—$C_4H_9$ |
| f | $CF_3(CF_2)_7SO_2N(C_2H_5)$—$(CH_2CH_2O)_{15}$—$\overset{O}{\underset{\|}{C}}$—$C_{14}H_{29}$ |

TABLE II-continued

| Example | Fluorosurfactant |
|---|---|
| g | CF$_3$(CF$_2$)$_8$SO$_2$NCH$_2$C[O(CH$_2$CH$_2$O)]$_{10}$C$_{11}$H$_{23}$ with CH$_3$ and O substituents |

In using a developer such as the potassium hydroxide developer without the fluorosurfactants of the invention or surfactants other than the fluorosurfactants of the invention, e.g., Aerosol OS (0.005%), the contrasts were 2.2 and 2.6, respectively. With a fluorocarbon surfactant according to the invention, for example, the contrast was 12.5. The photoresist used in the comparison was a novolak resin with a diazonaphthoquinone sulfonic acid ester photosensitizer. The photoresist coating was prepared by spin coating. The substrates were silicon wafers typical of those used in the manufacture of semiconductor devices. These wafers were subjected to a 200° C. dehydration bake followed by a precoating treatment with a 50% hexamethyldisilazane in xylene for 20 seconds immediately prior to coating. The wafers were spun at a speed so as to provide a one (1) micrometer (μm) thick resist film. The coated wafers were baked at 100° C. for 30 minutes in a forced air convection oven. After baking, the wafers were exposed through an Opto-Line step table resolution mask with windows of various optical density so as to provide various exposure levels on the same wafer. The incident exposure was such as to provide a range of exposure through the step tablet mask from no exposure to exposure sufficient for the resist to develop to the substrate. Other techniques can be employed by those skilled in the art to obtain areas or wafers of known exposure levels for the purpose of evaluation.

After exposure the resist can be contacted with the developer composition of the invention by any suitable manner for known developers, such as immersion, spray and puddle techniques. The novel developer composition of the invention operates at a pH of at least 9 and preferably at a pH above about 10.5 and more preferably above 12. Following development, the workpiece can be rinsed with water and further processed in a conventional manner. The thickness of the photoresist remaining at the various exposure levels can be measured by any suitable method, such as interferometry, profilometry, and elipsometry.

A plot as shown in Curve A was made of the film thickness remaining versus the log of the exposure level for each step. The contrast was determined from the curve as described above. In general, the higher the gamma, the better the performance of the resist/developer system. A preferred gamma value is that in excess of 5 and optimally a gamma of the order of 10 or greater. The mathematical relationship of this behavior is shown in the FIGURE of the drawing. Amounts of fluorocarbon surfactant from about 0.0001 percent of the developer to about 1.0% may be used with advantage. The more effective level of the fluorocarbon surfactant ranges from 0.0005% to 0.5%. The preferred range is 0.001 to 0.1%. The concentration of potassium hydroxide must be varied accordingly to maintain the sensitivity level. The more surfactant, the more concentrated the developer needs to be.

The alkali metal bases in addition to KOH include NaOH, LiOH, sodium silicate and the like, or compounds which when dissolved in the aqueous developer are capable of providing the equivalent ionic basicity of potassium hydroxide. When using sodium silicate, for example, the ratio of Na$_2$O to SiO$_2$ is preferably from 1:1 to 3:1. The amount of alkali metal hydroxide, e.g., when using KOH, may vary from about 0.1% to about 10% and preferably in the range of 0.5% to 5%. The following examples are illustrative of the invention. The enumeration of details in the examples should not be interpreted as limitations except as may be expressed in the appended claims.

EXAMPLE 1

A photoresist coating was prepared by spin coating a novolac resin and the photosensitizer shown in formula 15 of Table I. The substrate was a silicon wafer that had been subjected to a 200° C. dehydration bake for at least sixteen (16) hours; and then treated with a 50% hexamethyldisilazane solution in xylene for twenty seconds immediately prior to coating. The wafers were spun so as to provide a 1 micrometer (μm) thick film. The coated wafers were baked at 100° C. for 30 minutes in a forced air convection oven. After baking, the wafers were exposed to ultraviolet light through an Opto-Line step tablet resolution mask with windows of various optical density so as to provide various exposure levels on the same wafer. The incident exposure was such that a range of exposure from no exposure to exposure sufficient for the resist to develop to the substrate. A 0.25N aqueous potassium hydroxide developer solution was prepared. A resist composed of a novolak resin and sensitizer was coated and processed as described above. The coated substrates were immersion developed at 22° C. for 60 seconds in this developer solution. The workpiece was rinsed in deionized water and dried. The contrast and sensitivity data are shown in Table III.

EXAMPLE 2

A 0.25N aqueous potassium hydroxide developer solution was prepared with 0.005% Aerosol OS (sodium isopropylnaphthalene sulfonate, a nonfluorinated surfactant available from American Cyanamid) added. Substrates were prepared as described in Example 1. The processed substrates were immersion developed at 22° C. for 60 seconds in this developer solution. The workpiece was rinsed with deionized water and dried. The contrast and sensitivity data are shown in Table III.

EXAMPLE 3

A 0.27N aqueous sodium hydroxide developer solution was prepared. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 4

A 5.7% aqueous sodium metasilicate pentahydrate developer solution was prepared. Substrates were prepared as described in Example 1. The processed substrates were immersion developed at 22° C. for 60 seconds in this developer. The workpiece was rinsed in deionized water and dried. The contast and sensitivity data are shown in Table III.

EXAMPLE 5

A 0.271N aqueous potassium hydroxide developer solution was prepared with 0.016% of a mixture of fluorocarbon surfactants of the formula $F(CF_2)_{3-6}(CH_2CH_2O)_{5-26}CH_2CH_2OH$ added. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 6

A 0.27N aqueous sodium hydroxide developer solution was prepared with 0.013% of the surfactant mixture used in Example 5 added. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 7

A 5.7% aqueous sodium metasilicate pentahydrate developer solution was prepared with 0.015% of the surfactant used in Example 5 added. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 8

A 0.27N aqueous potassium hydroxide developer solution was prepared with 0.008% of a surfactant mixture of the formula $R_f$—$SO_2$—$N(Et)$—$(CH_2CH_2O)_{15-26}$—$CO$—$C_{24}H_{49}$ where $R_f$ was a saturated fluoroalkyl $C_5F_{11}$ to $C_7F_{15}$ with approximately 20% of the $R_f$+s being branched added. Substrates were prepared as described in Example 1. The processed substrates were immersion developed at 22° C. for 60 seconds in this developer solution. The workpiece was rinsed in deionized water and dried. The contrast and sensitivity data are shown in Table III.

EXAMPLE 9

A 0.27N aqueous potassium hydroxide developer solution was prepared with addition of 0.12% of a mixture of fluorocarbon compounds of the formula $R_f$—$(CH_2CH_2O)_{2-20}$—$CH_2CH_2OCH_3$ where $R_f$ was a saturated fluoroalkyl $C_5F_{11}$ to $C_7F_{15}$ with approximately 20% of the $R_f$+s being branched. Substrates were prepared as described in Example 1. The processed substrates were immersion developed at 22° C. for 60 seconds in this developer solution. The workpiece was rinsed with deionized water and dried. The contrast and sensitivity data are shown in Table III.

EXAMPLE 10

A 5.7% aqueous sodium metasilicate pentahydrate developer solution was prepared with 0.12% of the mixture of fluorocarbon surfactants used in Example 9. Substrates were prepared as described in Example 1. The processed substrates were immersion developed at 22° C. for 60 seconds in this developer solution. The workpiece was rinsed with deionized water and dried. The contrast and sensitivity data are shown in Table III.

EXAMPLE 11

A 0.16N aqueous sodium hydroxide developer solution was prepared. Silicon dioxide substrates were prepared as described in Example 1 except the sensitizer was comprised of a 60/30/10 ratio of Examples 11/1/7 from Table I. The processed substrates were immersion developed at 22° C. for 60 seconds in this developer solution. The workpiece was rinsed in deionized water and dried. The contrast and sensitivity data are shown in Table III.

EXAMPLE 12

A 0.16N aqueous sodium hydroxide developer solution was prepared with 0.015% of the surfactant mixture used in Example 5 added. Substrates were prepared as described in Example 11. The processed substrates were immersion developed at 22° C. for 60 seconds in this developer solution. The workpiece was rinsed in deionized water and dried. The contrast and sensitivity data are shown in Table III.

EXAMPLE 13

A 0.16N aqueous sodium hydroxide developer solution was prepared with 0.008% of the surfactant mixture in Example 8. Substrates were prepared as described in Example 11. The processed substrates were immersion developed at 22° C. for 60 seconds in this developer solution. The workpiece was rinsed in deionized water and dried. The contrast and sensitivity data are shown in Table III.

EXAMPLE 14

A developer as in Example 5 is prepared. Substrates are prepared as described in Example 1. The processed substrates are puddle developed at 22° C. for 30 seconds in this developer solution. The workpiece is rinsed with deionized water and dried. The contrast and sensitivity data are shown in Table III.

EXAMPLE 15

A 0.16N aqueous sodium hydroxide developer solution is prepared containing 0.01% of $CF_2(CF_2)_5$—$CO$—$N(CH_3)$—$(CH_2CH_2O)_{13}CH_3$. Substrates are prepared as described in Example 1. The processed substrates are immersion developed at 22° C. for 60 seconds in this developer solution. The workpiece is rinsed with deionized water and dried. The contrast and sensitivity data are shown in Table III.

EXAMPLE 16

A 0.16N aqueous sodium hydroxide developer solution is prepared containing 0.01% of $CF_3(CF_2)_3$—$SO_2$—$NH$—$(CH_2CH_2O)_{14}CH_3$. Substrates are prepared as described in Example 1. The processed substrates are immersion developed at 22° C. for 60 seconds in this developer solution. The workpiece is rinsed with deionized water and dried. The contrast and sensitivity data are shown in Table III.

EXAMPLE 17

A 0.25N aqueous potassium hydroxide developer solution is prepared containing 0.01% of $CF_3(CF_2)_8$—$SO_2$—$O$—$(CH_2CH_2O)_8$—$CH_3$. Substrates are prepared as described in Example 11. The processed substrates are immersion developed at 22° C. for 60 seconds in this developer solution. The workpiece is rinsed with deionized water and dried. The contrast and sensitivity data are shown in Table III.

EXAMPLE 18

A 0.16N aqueous sodium hydroxide developer solution is prepared containing 0.01% $CF_3(CF_2)_5$—$CO$—$O$—$(CH_2CH_2O)_9$—$C_4H_9$. Substrates are prepared as described in Example 1. The processed substrates are immersion developed at 22° C. for 60 seconds in this developer solution. The workpiece is rinsed with deionized water and dried. The contrast and sensitivity data are shown in Table III.

EXAMPLE 19

A 0.25N aqueous potassium hydroxide developer solution is prepared containing 0.01% of a mixture of the fluorocarbon surfactants of the formula $R_f$—$SO_2$—N(Et)—$CH_2CO_2$—$(CH_2CH_2O)_{15-26}$—$C_{25}H_{51}$. Substrates are prepared as described in Example 11. The processed substrates are immersion developed at 22° C. for 60 seconds in this developer solution. The workpiece is rinsed with deionized water and dried. The contrast and sensitivity data are shown in Table III.

which can thereafter be developed to form a surface relief pattern, which comprises:

contacting the exposed film with an aqueous alkaline developer solution comprising sufficient alkali metal base to obtain a pH of at least 9 and containing at least 0.0001 percent, based on the weight of the developer solution of a fluorocarbon surfactant having the formula:

$$R_f-Y-(CH_2CH_2O)_m R$$

wherein Y is a radical selected from the group consisting of —$CH_2CH_2O$—, —$SO_2NR'$, $SO_3$, $SO_2N(R')CH_2CO_2$, $CO_2$ and —CO—NR'
wherein $R_f$ is selected from the group consisting of straight and branched chains of the formula $C_pF_{2p+1}$

TABLE III

| Example | Base | Surfactant | Sensitivity (mJ/cm$^2$) | Contrast ($\gamma$) |
|---|---|---|---|---|
| 1 | KOH | None | 25 | 2.2 |
| 2 | KOH | Sodium isopropylnaphthalene sulfonate | 25 | 2.6 |
| 3 | NaOH | None | 4 | 1.9 |
| 4 | Na$_2$SiO$_3$ | None | 9 | 1.8 |
| 5 | KOH | F(CF$_2$CF$_2$)$_{3-6}$—(CH$_2$CH$_2$O)$_{5-26}$—CH$_2$CH$_2$OH | 8 | 12.5 |
| 6 | NaOH | See Example 5 | 17 | 7.6 |
| 7 | Na$_2$SiO$_3$ | See Example 5 | 26 | 8.3 |
| 8 | KOH | $^{(a)}$R$_f$SO$_2$—N(Et)—(CH$_2$CH$_2$O)$_{15-26}$—COC$_{24}$H$_{49}$ | 11 | 16.4 |
| 9 | KOH | $^{(a)}$R$_f$(CH$_2$CH$_2$O)(CH$_2$CH$_2$O)$_{2-20}$CH$_3$ | 11 | 3.3 |
| 10 | Na$_2$SiO$_3$ | See Example 9 | 14 | 2.8 |
| 11 | NaOH | None | 11 | 3.2 |
| 12 | NaOH | See Example 5 | 28 | 10.2 |
| 13 | NaOH | See Example 8 | 29 | 8.8 |
| 14 | KOH | See Example 5 | 8 | 12.0 |
| 15 | NaOH | CF$_3$(CF$_2$)$_5$—CO—N(CH$_3$)—(CH$_2$CH$_2$O)$_{12}$—CH$_3$ | 20 | 10.0 |
| 16 | NaOH | CF$_3$(CF$_2$)$_3$—SO$_3$—NH—(CH$_2$CH$_2$O)$_{14}$—CH$_3$ | 20 | 10.0 |
| 17 | KOH | CF$_3$(CF$_2$)$_8$—SO$_3$—(CH$_2$CH$_2$O)$_8$—CH$_3$ | 10 | 10.0 |
| 18 | NaOH | CF$_3$(CF$_2$)$_5$—CO$_2$—(CH$_2$CH$_2$O)$_9$—CH$_3$ | 15 | 10.0 |
| 19 | KOH | $^{(a)}$R$_f$SO$_2$—N(Et)—CH$_2$CO$_2$—(CH$_2$CH$_2$O)$_{15-26}$—C$_{25}$H$_{51}$ | 15 | 10.0 |

$^{(a)}$R$_f$ = C$_5$F$_{11}$—C$_7$F$_{15}$ with approximately 20% of R$_f$ being branched.

While the invention has been described with reference to positive photoresists sensitive to ultraviolet light (290-500 nm), the novel developer is applicable also to positive electron beam, X-ray, ion beam, deep ultraviolet (220-290 nm) light and other radiation sensitive resists.

The invention has been particularly described with reference to preferred embodiments thereof; it will be understood by those skilled in the art, however, that changes in form and details may be made therein without departing from the spirit and scope of the invention.

We claim:

1. A process for developing a positive radiation sensitive resist film for a gamma greater than 5, said film being comprised of radiation sensitive o-quinone diazide sulfonic acid derivative compounds and an alkali soluble resin that has been coated on a substrate and having been exposed to radiation in the form of a pattern, and where p is an integer of from 3-17 and wherein R is hydrogen or an acyl or alkyl radical of 1 to 30 carbon atoms and m is an integer of 2 to 26 and R' is hydrogen or an alkyl radical of 1-6 carbon atoms, until the exposed portions of the film are at least partially dissolved to form a resist pattern having a gamma greater than 5.

2. The process of claim 1 in which the film is exposed to ultraviolet radiation.

3. The process of claim 1 in which the fluorocarbon surfactant is present in the range of 0.0005 percent to 0.5 percent.

4. The process of claim 1 in which the surfactant is present in the range of 0.001 percent to 0.1 percent.

5. The process of claim 1 wherein the gamma is at least 10.

6. The process of claim 5 wherein the developer pH is above 12.

* * * * *